(12) United States Patent
Lim et al.

(10) Patent No.: US 10,644,191 B2
(45) Date of Patent: May 5, 2020

(54) SEMICONDUCTOR PACKAGE SEPARATING DEVICE

(71) Applicant: SAMSUNG ELECTRONICS CO., LTD., Suwon-si (KR)

(72) Inventors: Jong Ho Lim, Suwon-si (KR); Jong Sup Song, Hwaseong-si (KR); Houn Joung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 70 days.

(21) Appl. No.: 15/980,267

(22) Filed: May 15, 2018

(65) Prior Publication Data

US 2019/0131488 A1    May 2, 2019

(30) Foreign Application Priority Data

Oct. 30, 2017    (KR) .................. 10-2017-0142469

(51) Int. Cl.
*H01L 33/00* (2010.01)
*H01L 33/62* (2010.01)

(52) U.S. Cl.
CPC ........ *H01L 33/005* (2013.01); *H01L 33/0095* (2013.01); *H01L 33/62* (2013.01); *H01L 2933/0033* (2013.01)

(58) Field of Classification Search
CPC ........... H01L 33/005; H01L 2933/0033; H01L 33/62; H01L 21/67126; H01L 2924/00; H01L 21/4842; H01L 23/495; H01L 2924/0002; H01L 21/67092; H01L 21/68; H01L 21/66; B26D 7/1854;
(Continued)

(56) References Cited

U.S. PATENT DOCUMENTS 4,633,919 A  *  1/1987  Shiloh ............... H05K 13/0092
                                                      140/105
5,152,206 A  *  10/1992  Mulling .................. B26D 1/22
                                                      83/425.3
(Continued)

FOREIGN PATENT DOCUMENTS

JP          3638548 B2    4/2005
JP       2012-244112 A   12/2012
(Continued)

*Primary Examiner* — Ghassem Alie
(74) *Attorney, Agent, or Firm* — Sughrue Mion, PLLC (57) ABSTRACT

A semiconductor package separating device is provided. The semiconductor package separating device includes a die configured to support a lead frame array including a fixing portion inserted into an insertion groove formed on at least a side surface of a semiconductor package to support the semiconductor package; and a cylindrical punch configured to rotate in a rotational direction, the cylindrical punch including a bending protrusion and a package separating protrusion that are provided on an outer circumferential surface of the cylindrical punch, the bending protrusion being configured to apply pressure to the fixing portion to bend the fixing portion, and the package separating protrusion being configured to apply pressure to the semiconductor package to separate the semiconductor package from the lead frame array in a state in which the fixing portion has been bent by the bending protrusion.

20 Claims, 10 Drawing Sheets

(58) Field of Classification Search
CPC ............. B26D 2210/08; B26F 2210/08; Y10T 83/207; Y10T 29/49121; Y10T 83/9428; Y10T 83/06; Y10T 83/944; G01R 31/26; G01R 31/00
USPC ............ 225/6; 83/942, 98, 100, 99, 685, 55, 83/691, 698, 955, 686, 687, 690, 692, 83/693, 700; 29/827, 566, 845
See application file for complete search history.

(56) References Cited

U.S. PATENT DOCUMENTS

| | | | |
|---|---|---|---|
| 5,683,045 A * | 11/1997 | Staniszewski | B02C 18/0007 |
| | | | 225/97 |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 10,368,551 B2 * | 8/2019 | Erickson | A21D 13/41 |
| 2010/0078803 A1 | 4/2010 | Andou et al. | |

FOREIGN PATENT DOCUMENTS

| | | |
|---|---|---|
| JP | 2013-239625 A | 11/2013 |
| JP | 2017-69233 A | 4/2017 |
| KR | 2003-0069996 A | 8/2003 |
| KR | 10-0643431 B1 | 11/2006 |
| KR | 10-2015-0025030 A | 3/2015 |
| WO | 02/27779 A2 | 4/2002 |

* cited by examiner

SEMICONDUCTOR PACKAGE SEPARATING DEVICE

CROSS-REFERENCE TO RELATED APPLICATION

This application claims priority from Korean Patent Application No. 10-2017-0142469 filed on Oct. 30, 2017, in the Korean Intellectual Property Office, the disclosure of which is incorporated herein by reference in its entirety.

BACKGROUND

1. Field

Methods and apparatuses consistent with example embodiments relate to a semiconductor package separating device.

2. Related Art

Light emitting devices, which use light emitting diode (LED) chips as light sources, generally include a body and a lead frame, and may be sealed inside a package structure using a transparent resin.

In general, such light emitting device packages are manufactured by mounting LED chips on a lead frame, forming package bodies, and separating respective light emitting device packages from the lead frame using a punching process. However, there is a problem in which light emitting device packages may be damaged by mechanical impacts applied during a process of separating light emitting device packages from a lead frame using a punching process.

SUMMARY

Example embodiments provide a semiconductor package separating device.

According to an aspect of an example embodiment, there is provided a semiconductor package separating device including: a die configured to support a lead frame array including a fixing portion inserted into an insertion groove formed on at least a side surface of a semiconductor package to support the semiconductor package; and a cylindrical punch configured to rotate in a rotational direction, the cylindrical punch including a bending protrusion and a package separating protrusion that are provided on an outer circumferential surface of the cylindrical punch, the bending protrusion being configured to apply pressure to the fixing portion to bend the fixing portion, and the package separating protrusion being configured to apply pressure to the semiconductor package to separate the semiconductor package from the lead frame array in a state in which the fixing portion has been bent by the bending protrusion.

According to an aspect of another example embodiment, there is provided a semiconductor package separating device including: a die configured to support a lead frame array including a plurality of fixing portions, each of the plurality of fixing portions being inserted into an insertion groove formed on at least a side surface of each of a plurality of semiconductor packages sequentially arranged in a direction to support the plurality of semiconductor packages; and a cylindrical punch configured to rotate in a rotational direction, the cylindrical punch including a plurality of bending protrusions and a plurality of package separating protrusions that are disposed on an outer circumferential surface of the cylindrical punch, each of the plurality of bending protrusions being configured to apply pressure to a fixing portion from among the plurality of fixing portions to bend the fixing portion, and each of the plurality of package separating protrusions being configured to apply pressure to a semiconductor package from among the plurality of semiconductor packages to separate the semiconductor package from the lead frame array in a state in which the fixing portion corresponding to the semiconductor package has been bent.

According to an aspect of yet another example embodiment, there is provided a semiconductor package separating device including: a die configured to support a lead frame array including a fixing portion inserted into an insertion groove formed on at least a side surface of each of a plurality of semiconductor packages sequentially arranged in a direction to support the plurality of semiconductor packages; a cylindrical punch configured to rotatably move in the direction, the cylindrical punch including a bending protrusion and a package separating protrusion that are provided on an outer circumferential surface of the cylindrical punch, the bending protrusion being configured to apply pressure to the fixing portion to bend the fixing portion, and the package separating protrusion being configured to apply pressure to a semiconductor package of the plurality of semiconductor packages with a bent fixing portion to separate the semiconductor package from the lead frame array in a state in which the fixing portion has been bent by the bending protrusion; and a driver configured to rotatably move the cylindrical punch in the direction.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, example embodiments will be described with reference to the accompanying drawings.

Figure 1:
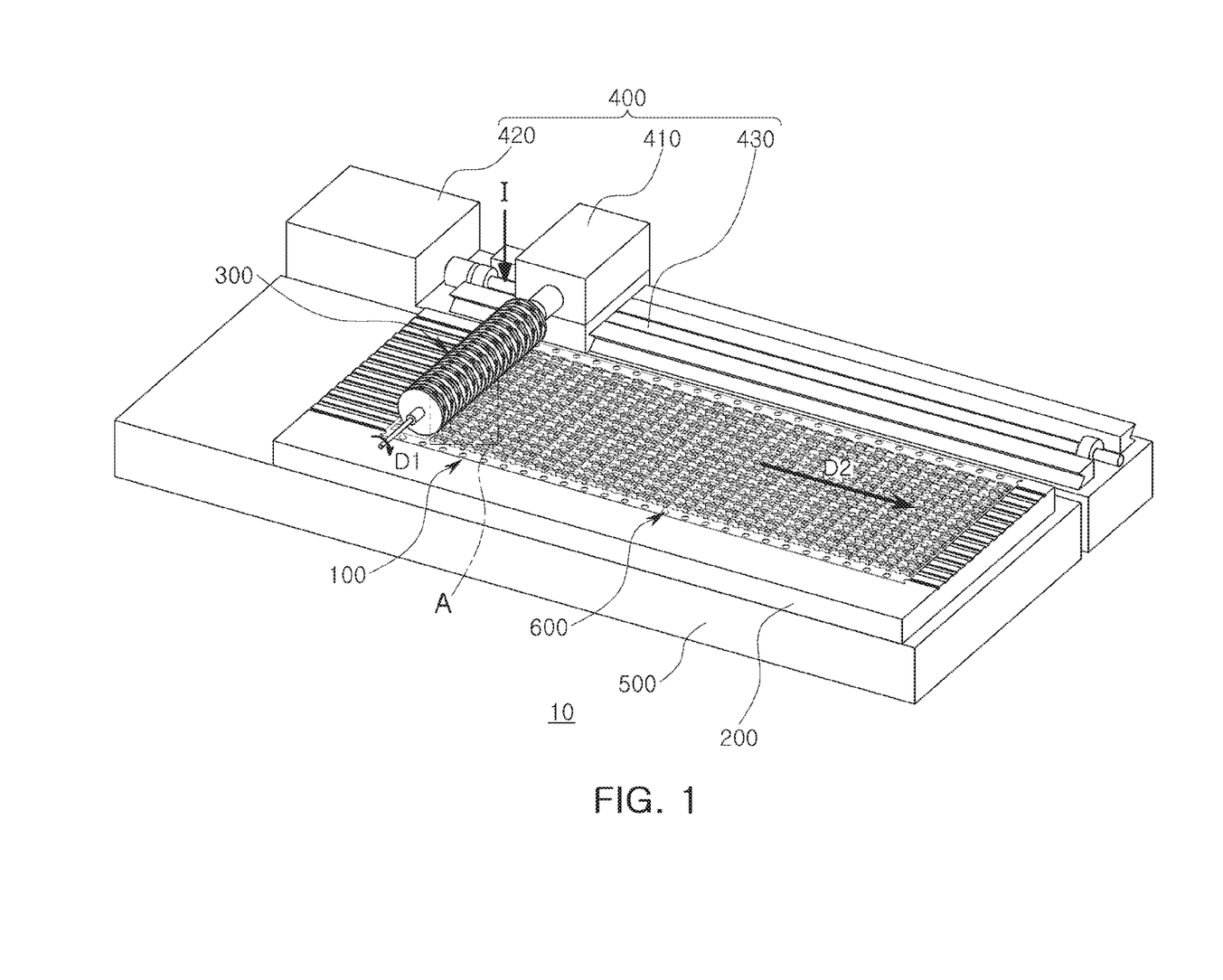
FIG. 1 is a schematic perspective view of a semiconductor package separating device according to an example embodiment.
Figure 2:
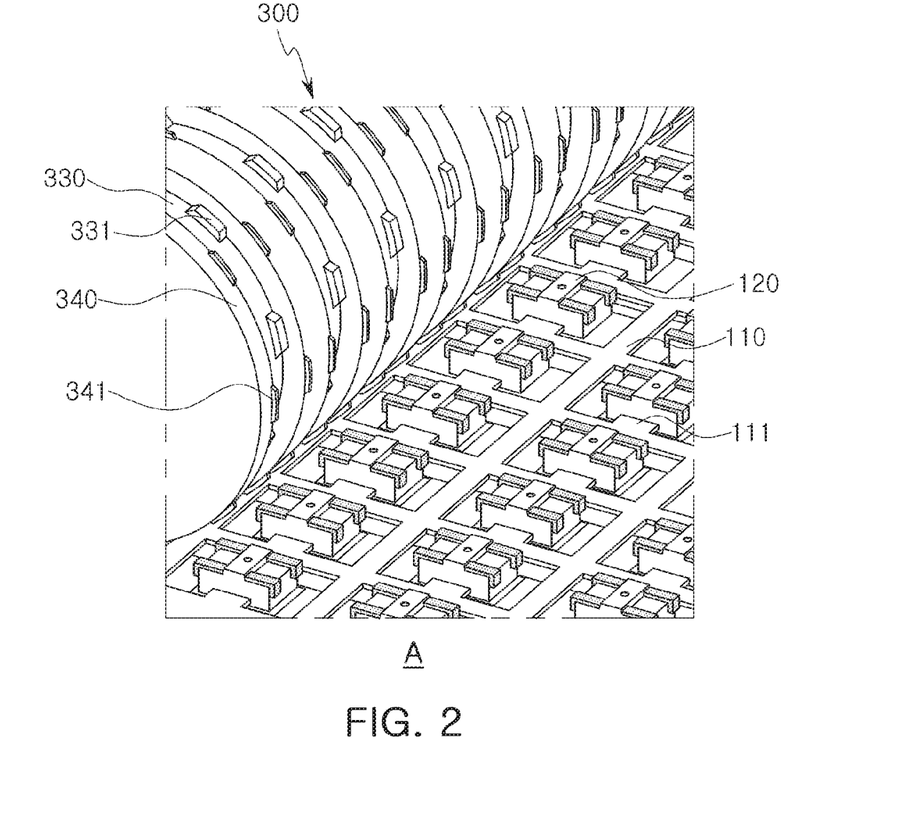
FIG. 2 is an enlarged view of portion "A" of FIG. 1.
Figure 3:
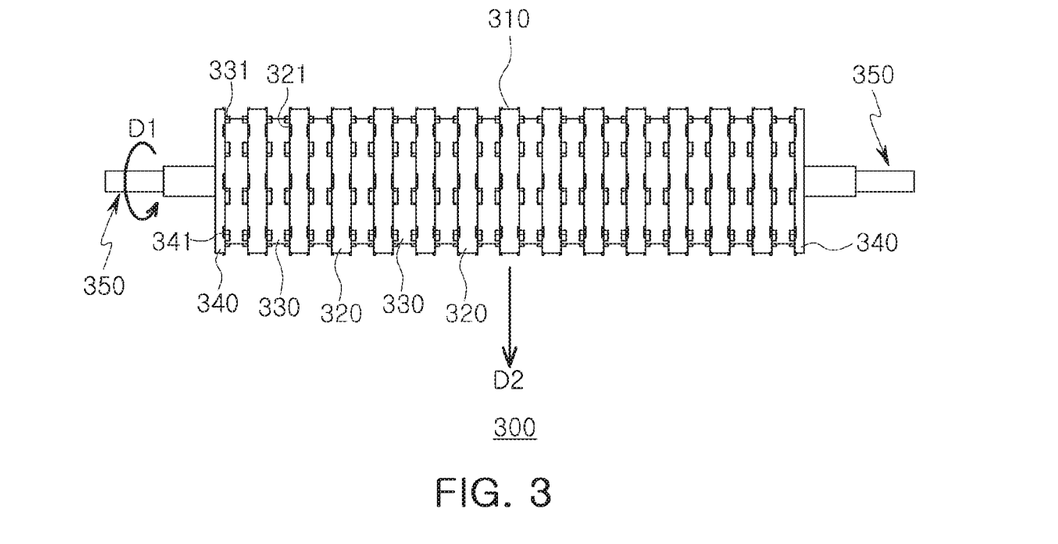
FIG. 3 is a top view of a cylindrical punch of FIG. 1 when viewed in an I direction.
Figure 4:
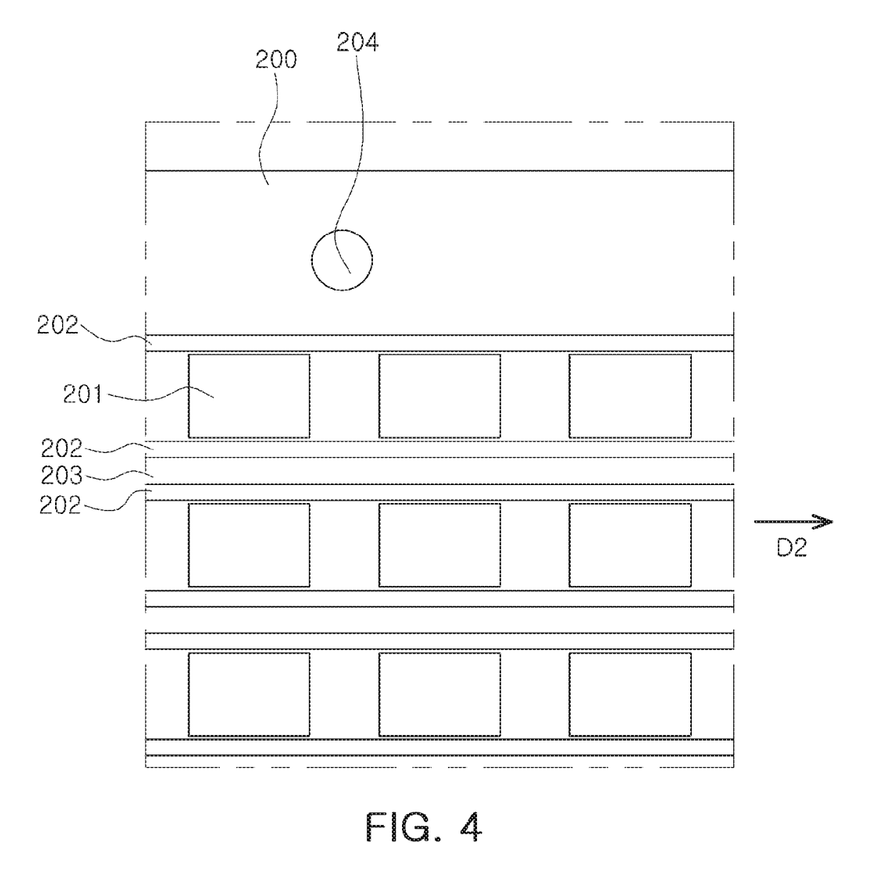
FIG. 4 is a top view of a die of FIG. 1 when viewed in the I direction.

A semiconductor package separating device according to an example embodiment will be described with reference to FIGS. 1 through 4. FIG. 1 is a schematic perspective view of a semiconductor package separating device according to an example embodiment, while FIG. 2 is an enlarged view of portion "A" of FIG. 1. FIG. 3 is a top view of a cylindrical punch of FIG. 1 when viewed in an I direction, while FIG. 4 is a top view of a die of FIG. 1 when viewed in the I direction.

With reference to FIG. 1, a semiconductor package separating device 10 according to an example embodiment includes a die 200, a lead frame array 100 is mounted on an upper surface of the die 200, and a cylindrical punch 300 configured to separate a semiconductor package 120 from the lead frame array 100. In addition, the semiconductor package separating device 10 may further include a driver 400 that controls the cylindrical punch 300 to be rotatably moved, and a stage 500 on which the die 200 is mounted.

With reference to FIGS. 1 and 2, the lead frame array 100 may include a connection frame 110 to which a plurality of semiconductor packages 120 are fixed by fixing portions 111 of the connection frame 110.

Figure 5:
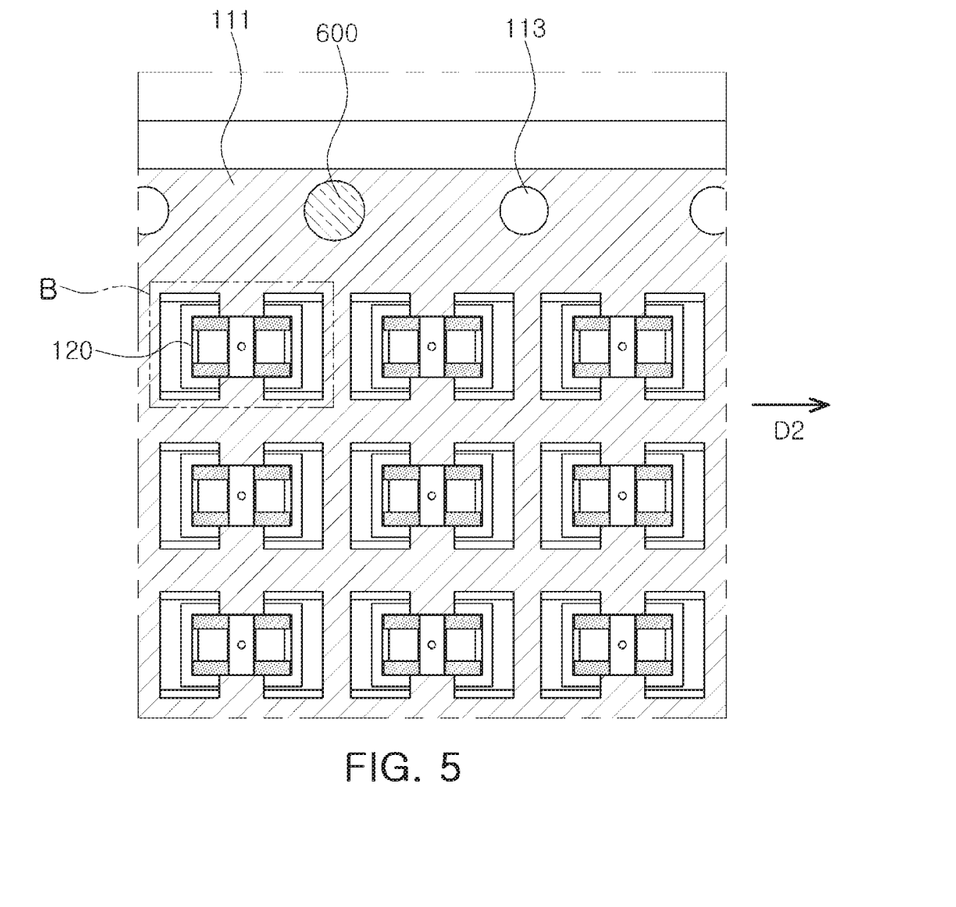
FIG. 5 is a top view of a lead frame array disposed on the die of FIG. 4.
Figure 6A:
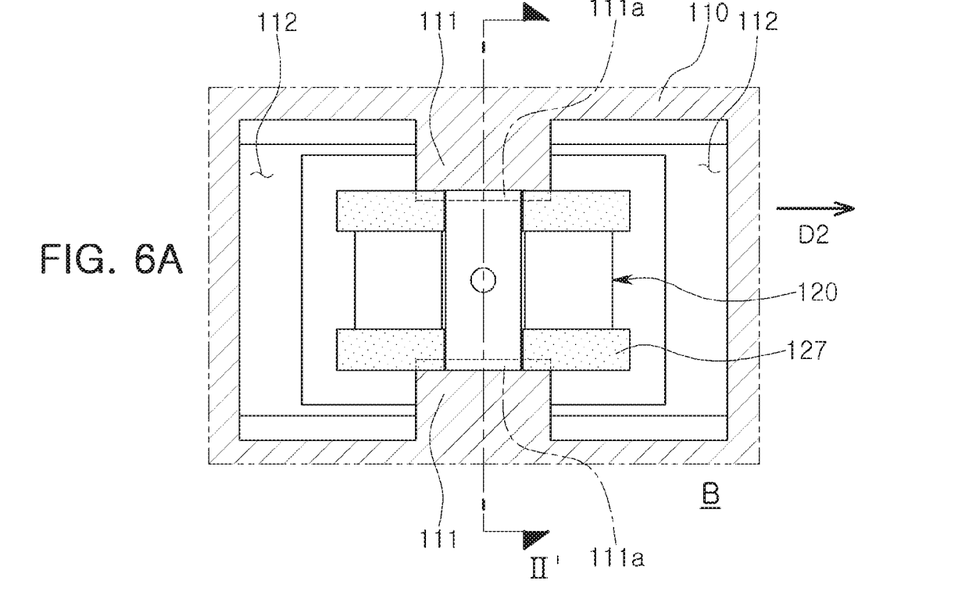
FIG. 6A is an enlarged view of portion "B" of FIG. 5.
Figure 6B:
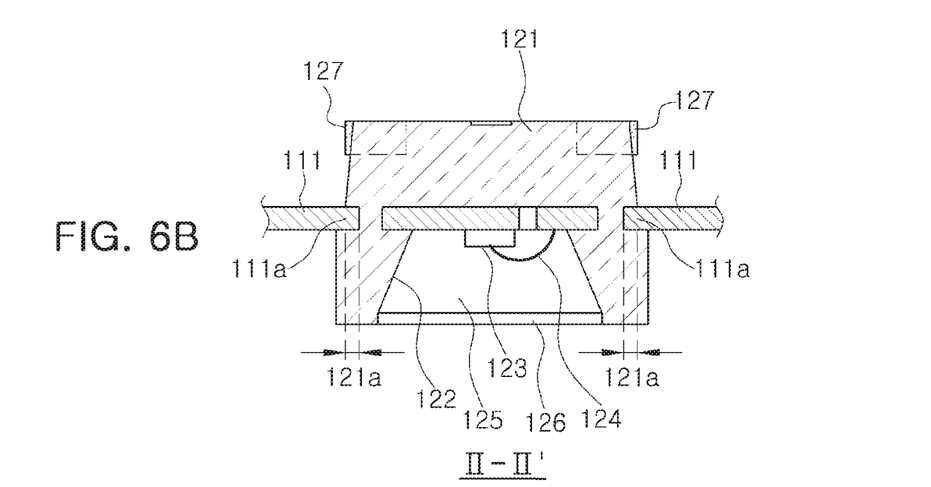
FIG. 6B is a cross-sectional view taken along line II-II' of FIG. 6A.

With reference to FIGS. 5, 6A and FIG. 6B, a plurality of through-holes 112 that individually accommodate the semiconductor packages 120 may be disposed in rows and columns in the connection frame 110. The plurality of through-holes 112 may be disposed in rows and columns corresponding to a direction D2 in which the cylindrical punch 300 is rotatably moved. A through hole 113, through which a fixing pin 600 penetrates to fix the lead frame array 100 to the die 200, may be formed on a side of the connection frame 110.

The fixing portion 111 may extend from opposing side portions of the plurality of through-holes 112. Each of the semiconductor packages 120 may be supported by fixing portions 111. For example, an end portion 111a of the fixing portion 111 may be coupled to a groove portion 121a of a package body 121 of the semiconductor package 120 by a process of molding the package body 121 of the semiconductor package 120. As such, the end portion 111a of the fixing portion 111 may be coupled to the package body 121. Thus, if the fixing portion 111 is punched vertically from an upper portion thereof to separate the semiconductor package 120 from the lead frame array 100, the end portion 111a of the fixing portion 111 may be bent obliquely and the package body 121 may be damaged.

In an example embodiment, a central portion of the fixing portion 111 may be bent in the direction D2 so that the end portion 111a of the fixing portion 111 may be detached from the groove portion 121a of the package body 121 in a horizontal direction, rather than a vertical direction. Subsequently, pressure may be applied to the semiconductor package 120 to separate the semiconductor package 120 from the lead frame array 100, thereby preventing the package body 121 from being damaged by the end portion 111a of the fixing portion 111.

The semiconductor package 120 may have a package structure in which a light emitting diode (LED) chip 123 is mounted in the package body 121 having a reflective cup 122. In addition, the LED chip 123 may be electrically connected to the electrode pad 127 by a wire 124 and may be covered by an encapsulation portion 125 containing a phosphor.

With reference to FIGS. 1 and 4, the die 200 may have a flat upper surface in which a plurality of through-holes 201 are provided along a direction D2 in which the cylindrical punch 300 is rotatably moved. Each through-hole 201 may be formed at a point at which the semiconductor package 120 drops to a lower portion of the die 200 when separated from the lead frame array 100.

Each through-hole 201 may be formed to have a size sufficient to accommodate the semiconductor package 120, thereby preventing the semiconductor package 120 from impacting a wall surface and being damaged when the semiconductor package 120 is dropped.

The die 200 may include guide grooves 202 provided on opposing sides of the through-holes 201. The guide grooves 202 may be formed to extend from one side of the die 200 to the other side of the die 200 in the direction D2.

Each guide groove 202 may be provided as a portion in which the fixing portion 111 is disposed to intersect, when the lead frame array 100 is mounted on the die 200. The guide groove 202 may combine with a bending protrusion 321 of the cylindrical punch 300 (see FIG. 3) to bend a central region of the fixing portion 111 in the direction D2, thereby allowing the end portion 111a of the fixing portion 111 to detach from the groove portion 121a of the package body 121 in a horizontal direction. In this case, the bending protrusion 321 may bend the fixing portion 111 a number of times in the direction D2.

A fixing support portion 203 configured to prevent the fixing portion 111 from being significantly transformed in a process of bending the central region of the fixing portion 111 may be disposed between adjacent guide grooves 202. A coupling groove 204 into which the fixing pin 600 to fix the lead frame array 100 to the die 200 is inserted may be formed on a side of the die 200 in the direction D2.

With reference to FIGS. 1 and 3, a central axis 350 is rotatably coupled to the driver 400 so the cylindrical punch 300 may be rotated by the driver 400 in a rotational direction D1. In addition, the cylindrical punch 300 may be moved in the direction D2 while the cylindrical punch 300 applies pressure to the die 200 by the driver 400.

An outer circumferential surface 310 of the cylindrical punch 300 may be configured such that a plurality of protruding portions 320 and a plurality of groove portions 330 are alternately disposed in a side by side manner in the rotational direction D1. Each of the plurality of groove portions 330 may be disposed between the plurality of protruding portions 320.

Figure 7:
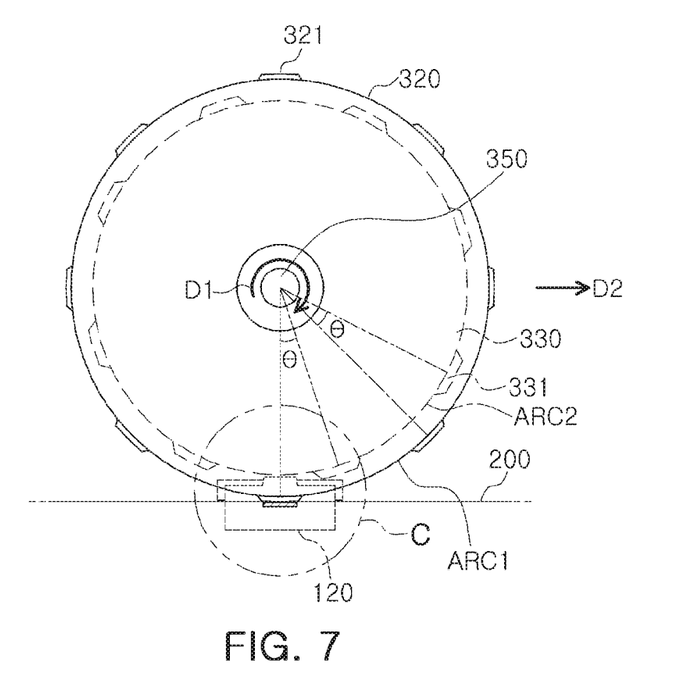
FIG. 7 is a view illustrating a process in which a bending protrusion of FIG. 1 rolls a fixing portion of a semiconductor package to be bent, when viewed from a central axis.

With reference to FIGS. 3 and 7, a bending protrusion 321 to apply pressure to the fixing portion 111 of the lead frame array 100 to bend the fixing portion 111 may be disposed on a protruding portion 320. As illustrated, in an example embodiment, the bending protrusion 321 may include a plurality of bending protrusions 321 disposed to be spaced apart from each other by a predetermined interval. The plurality of bending protrusions 321 may be disposed to correspond to fixing portions 111, respectively. The bending protrusions 321 may be disposed in two columns along each protruding portion 320. On the other hand, single-column bending protrusions 341 may be disposed on an end protruding portion 340 provided at an end portion of the cylindrical punch 300.

A package separating protrusion 331 to apply pressure to the semiconductor package 120 to be separated from the lead frame array 100 may be disposed on a lower surface of the groove portion 330. As illustrated in an example embodiment, the package separating protrusion 331 may include a plurality of package separating protrusions 331 disposed to be spaced apart from each other by a predetermined interval. The plurality of package separating protrusions 331 may be disposed to correspond to semiconductor packages 120, respectively.

As illustrated in FIG. 7, a surface ARC1 of the protruding portion 320 and a surface ARC2 of the lower surface of the groove portion 330 may be disposed to have a circular shape having different radii based on the central axis 350.

The driver 400 may include a first driver 410 coupled to the central axis 350 of the cylindrical punch 300 to rotate the cylindrical punch 300 and a second driver 420 connected to the first driver to allow the first driver 410 to be horizontally moved on a drive shaft 430 in the direction D2. In an example embodiment, the second driver 420 moves the first driver 410 horizontally in the direction D2. According to another example embodiment, the second driver 420 moves the die 200 horizontally in a direction opposed to the direction D2.

With reference to FIGS. 7 to 12, a process in which a single semiconductor package 120 is separated from a lead frame array 100 while a cylindrical punch 300 is rotatably moved according to an example embodiment will be described in detail.

Figure 8:
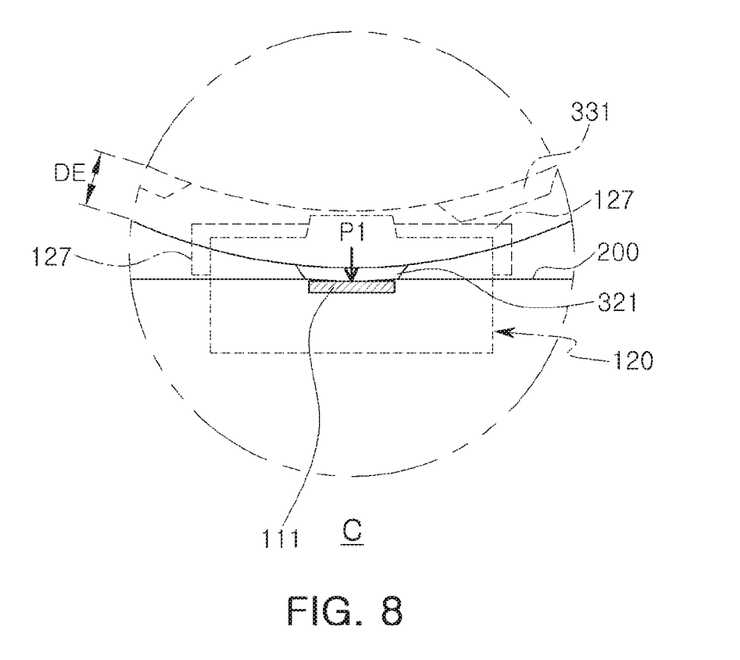
FIG. 8 is an enlarged view of portion "C" of FIG. 7.
Figure 9:
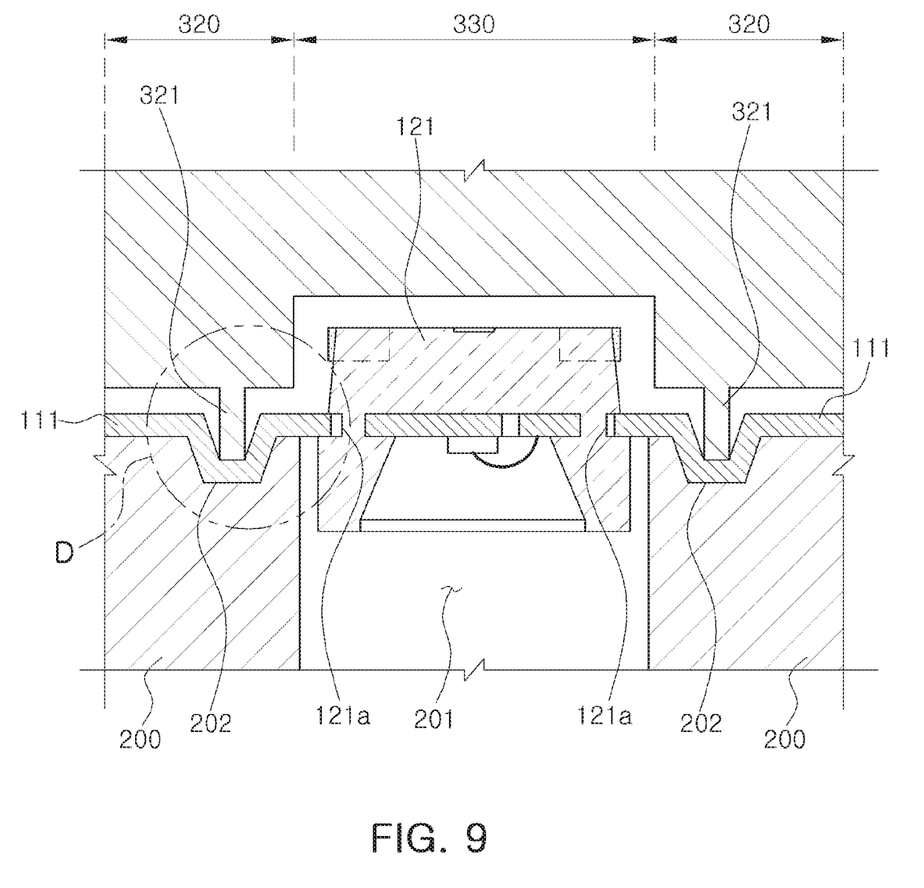
FIG. 9 is a view illustrating a process in which the bending protrusion rolls the fixing portion of the semiconductor package to be bent, when viewed in a direction D2.
Figure 10:
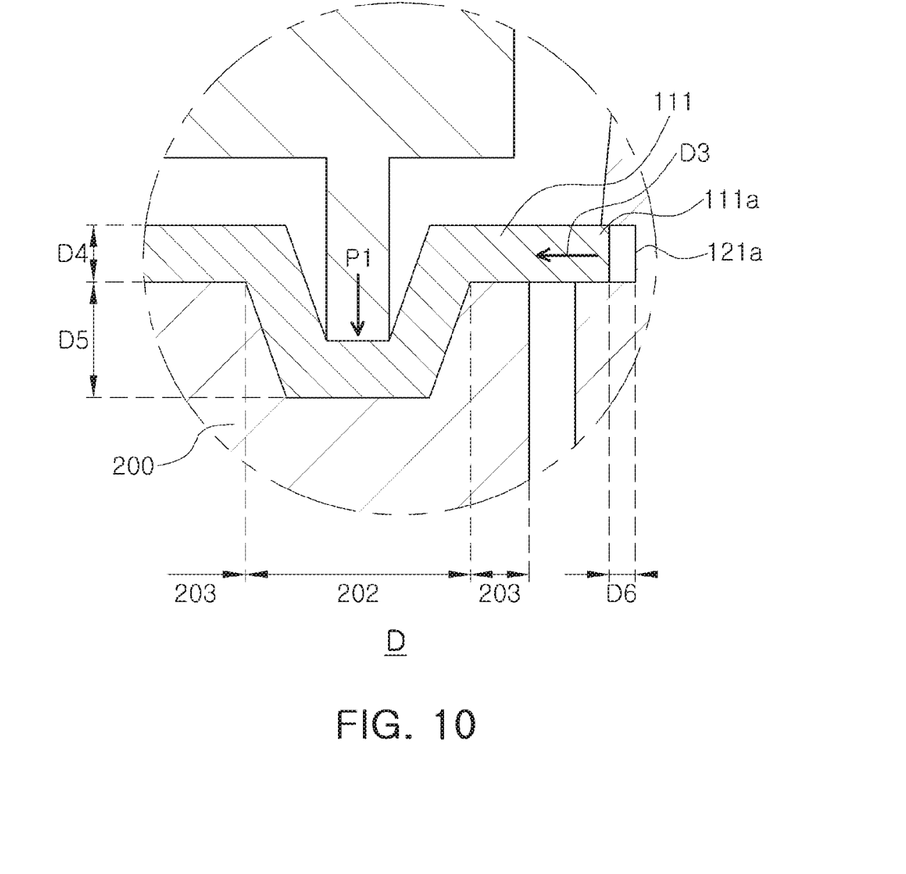
FIG. 10 is an enlarged view of portion "D" of FIG. 9.
Figure 11:
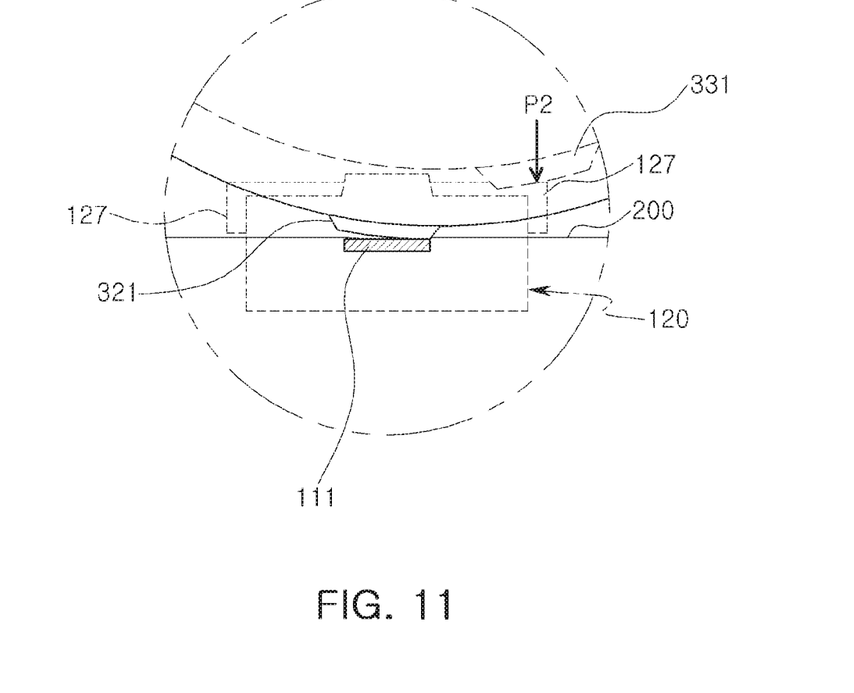
FIG. 11 is a view illustrating a process in which a package separating protrusion applies pressure the semiconductor package to separate the semiconductor package.

FIG. 7 is a view illustrating a process in which a bending protrusion 321 rolls over a fixing portion of a semiconductor package to be bent, when viewed from a central axis, while FIG. 8 is an enlarged view of portion "C" of FIG. 7. FIG. 9 is a view illustrating a process in which the bending protrusion 321 rolls the fixing portion 111 of the semiconductor package to be bent, when viewed in a direction D2, while FIG. 10 is an enlarged view of portion "D" of FIG. 9. FIG. 11 is a view illustrating a process in which a package separating protrusion applies pressure to the semiconductor package to separate the semiconductor package, while FIG. 12 is a view illustrating a process in which the package separating protrusion applies pressure to the semiconductor package to separate the semiconductor package, when viewed in the direction D2.

First, as illustrated in FIGS. 7 and 8, when a central axis 350 of the cylindrical punch 300 is rotated in a rotational direction D1 to move the cylindrical punch 300 in a direction D2, a bending protrusion 321 may apply pressure P1 to a fixing portion 111 to be bent. In this case, a package separating protrusion 331 may be disposed to be offset from a bending protrusion 321 to have an angle θ with respect thereto, and the bending protrusion 321 may be disposed lower than the package separating protrusion 331 by a distance equal to a distance DE. Thus, the package separating protrusion 331 is spaced apart from the semiconductor package 120, thereby preventing pressure from being applied to the semiconductor package 120 before the fixing portion 111 is bent.

As illustrated in FIGS. 9 and 10, in a case in which the fixing portion 111 is bent, an end portion 111a of the fixing portion 111 is pulled in a direction D3 in which the fixing portion 111 is bent (i.e., in a direction away from groove portion 121a). Thus, the end portion 111a of the fixing portion 111 may be detached from a groove portion 121a of a package body 121 by a distance D6 in the direction D3 in which the fixing portion 111 is bent. Because the end portion 111a of the fixing portion 111 is horizontally detached from the groove portion 121a of the package body 121, the package body 121 may be prevented from being damaged in a process in which the end portion 111a is detached. A depth D5 of a guide groove 202 may be twice a thickness D4 of the fixing portion 111. In an example embodiment, a case in which the fixing portion 111 is bent four times is described as an example, but the fixing portion 111 may be bent two or three times, according to other example embodiments.

Figure 12:
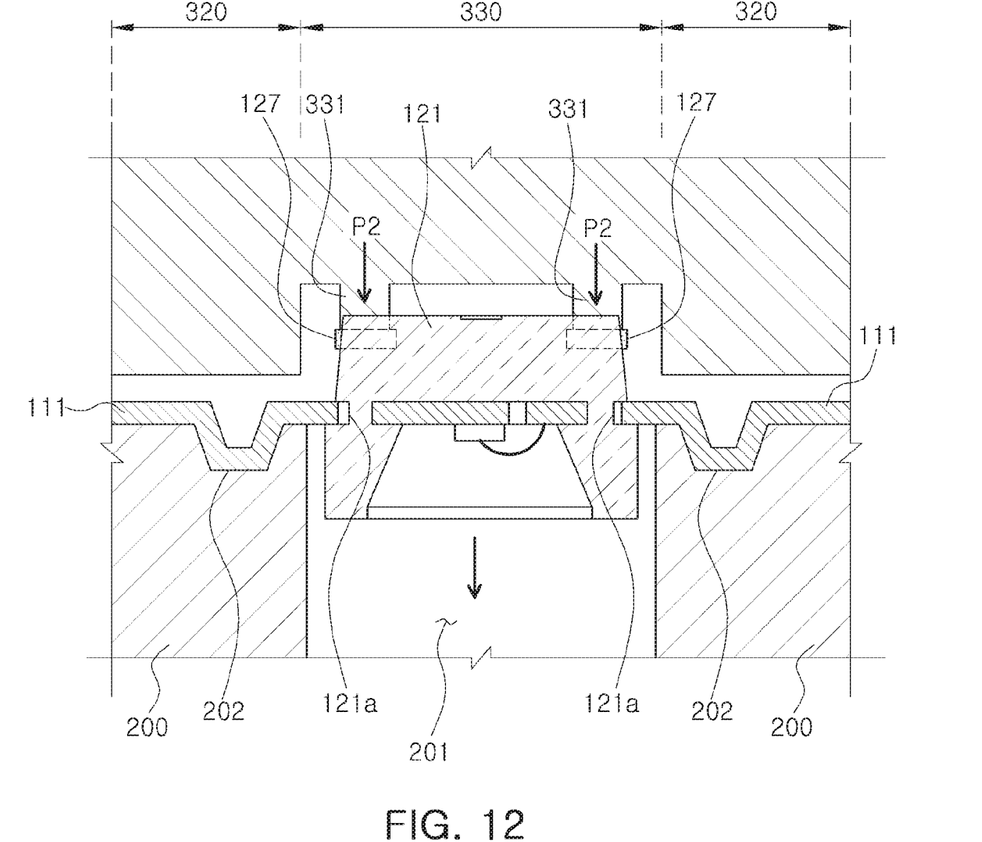
FIG. 12 is a view illustrating a process in which the package separating protrusion applies pressure to the semiconductor package to separate the semiconductor package, when viewed in the direction D2.

Subsequently, as illustrated in FIGS. 11 and 12, as the cylindrical punch 300 is rotated, the package separating protrusion 331 may apply pressure P2 to an upper portion of the semiconductor package 120, thereby allowing the semiconductor package 120 to be dropped to a through-hole 201 of the die 200.

As set forth above, according to example embodiments, a semiconductor package separating device preventing a semiconductor package from being damaged by mechanical impacts of a punch in a process of separating the semiconductor package may be provided.

While example embodiments have been shown and described above, it will be apparent to those skilled in the art that modifications and variations could be made without departing from the scope of the present inventive concept.

What is claimed is:

1. A semiconductor package separating device comprising:
   a die configured to support a lead frame array including a fixing portion inserted into an insertion groove formed on at least a side surface of a semiconductor package to support the semiconductor package; and
   a cylindrical punch configured to rotate in a rotational direction, the cylindrical punch including a protruding portion and a groove portion that are provided on an outer circumferential surface of the cylindrical punch along the rotational direction, the protruding portion comprising a bending protrusion configured to apply pressure to the fixing portion to bend the fixing portion, and the groove portion comprising a package separating protrusion configured to apply pressure to the semiconductor package to separate the semiconductor package from the lead frame array in a state in which the fixing portion has been bent by the bending protrusion,
   wherein the bending protrusion is one of a plurality of bending protrusions sequentially formed on the protruding portion along the rotational direction, and
   wherein the package separating protrusion is one of a plurality of package separating protrusions sequentially formed on the groove portion along the rotational direction.

2. The semiconductor package separating device of claim 1, wherein the die includes a guide groove provided on an upper surface of the die and configured to guide bending of the fixing portion by the bending protrusion.

3. The semiconductor package separating device of claim 2, wherein the guide groove is provided a position corresponding to the bending protrusion, and the bending protrusion is bent toward the guide groove.

4. The semiconductor package separating device of claim 1, further comprising a driver configured to move the cylindrical punch with respect to the lead frame array.

5. The semiconductor package separating device of claim 1, wherein the protruding portion and the groove portion are provided adjacent to each other on the outer circumferential surface of the cylindrical punch.

6. The semiconductor package separating device of claim 5, wherein the bending protrusion is provided on the protruding portion, and the package separating protrusion is provided on the groove portion.

7. The semiconductor package separating device of claim 5, wherein the protruding portion comprises a plurality of protruding portions,
   the groove portion comprises a plurality of groove portions, and the plurality of protruding portions and the plurality of groove portions are alternately provided on the outer circumferential surface of the cylindrical punch along the rotational direction.

8. The semiconductor package separating device of claim 7, wherein each of the plurality of groove portions is provided between two of the plurality of protruding portions.

9. The semiconductor package separating device of claim 5, wherein
the plurality of bending protrusions are spaced apart from each other by a predetermined interval in the rotational direction.

10. The semiconductor package separating device of claim 5, wherein
the plurality of package separating protrusions are provided on a lower surface of the groove portion and spaced apart from each other by a predetermined interval in the rotational direction.

11. The semiconductor package separating device of claim 5, wherein the bending protrusion and the package separating protrusion are offset from each at a predetermined angle with respect to a central axis of the cylindrical punch.

12. A semiconductor package separating device comprising:
a die configured to support a lead frame array including a plurality of fixing portions, each of the plurality of fixing portions being inserted into an insertion groove formed on at least a side surface of each of a plurality of semiconductor packages to support the plurality of semiconductor packages, the plurality of semiconductor packages being sequentially arranged in a direction; and
a cylindrical punch configured to rotate in a rotational direction, the cylindrical punch including a plurality of bending protrusions and a plurality of package separating protrusions that are disposed on an outer circumferential surface of the cylindrical punch, each of the plurality of bending protrusions being configured to apply pressure to a fixing portion from among the plurality of fixing portions to bend the fixing portion, and each of the plurality of package separating protrusions being configured to apply pressure to a semiconductor package from among the plurality of semiconductor packages to separate the semiconductor package from the lead frame array in a state in which the fixing portion corresponding to the semiconductor package has been bent,
wherein each of the plurality of bending protrusions is sequentially formed on along the rotational direction, and
wherein each of the plurality of package separating protrusions is sequentially formed along the rotational direction.

13. The semiconductor package separating device of claim 12, wherein the die includes a plurality of guide grooves provided on an upper surface of the die and configured to guide bending of the plurality of fixing portions by the plurality of bending protrusions.

14. The semiconductor package separating device of claim 12, wherein the die includes a plurality of guide grooves provided at positions corresponding to the plurality of bending protrusions, and the plurality of bending protrusions are bent toward the plurality of guide grooves.

15. The semiconductor package separating device of claim 12, wherein a plurality of through-holes are formed in the lead frame array, each of the plurality of through-holes being configured to individually accommodate the plurality of semiconductor packages, the plurality of through-holes being spaced apart from each other in the direction, and
wherein the plurality of fixing portions protrude from opposing side surfaces of the plurality of through-holes.

16. The semiconductor package separating device of claim 12, wherein the plurality of bending protrusions are configured to bend the plurality of fixing portions.

17. A semiconductor package separating device comprising:
a die configured to support a lead frame array including a fixing portion inserted into an insertion groove formed on at least a side surface of each of a plurality of semiconductor packages to support the plurality of semiconductor packages the plurality of semiconductor packages being sequentially arranged in a direction;
a cylindrical punch configured to rotatably rotate in a rotational direction to move in the direction, the cylindrical punch including a protruding portion and a groove portion that are provided on an outer circumferential surface of the cylindrical punch along the rotational direction, the protruding portion comprising a bending protrusion configured to apply pressure to the fixing portion to bend the fixing portion, and the groove portion comprising a package separating protrusion configured to apply pressure to a semiconductor package of the plurality of semiconductor packages with a bent fixing portion to separate the semiconductor package from the lead frame array in a state in which the fixing portion has been bent by the bending protrusion; and
a driver configured to rotatably move the cylindrical punch in the direction,
wherein the bending protrusion is one of a plurality of bending protrusions sequentially formed on the protruding portion along the rotational direction, and
wherein the package separating protrusion is one of a plurality of package separating protrusions sequentially formed on the groove portion along the rotational direction.

18. The semiconductor package separating device of claim 17, wherein the driver comprises a first driver and a second driver, the first driver being coupled to a central axis of the cylindrical punch and configured to control rotation of the cylindrical punch, and the second driver being configured to horizontally move the first driver in the direction.

19. The semiconductor package separating device of claim 17, wherein a guide groove extends in the direction along an upper surface of the die.

20. The semiconductor package separating device of claim 17, wherein the bending protrusion is configured apply pressure to the fixing portion to bend the fixing portion.

* * * * *